(12) United States Patent
Lan

(10) Patent No.: US 12,660,636 B2
(45) Date of Patent: Jun. 16, 2026

(54) PACKAGING STRUCTURE, PACKAGING SUBSTRATE, AND MANUFACTURING METHOD OF THE PACKAGING STRUCTURE

(71) Applicants: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

(72) Inventor: Zhi-Cheng Lan, Shenzhen (CN)

(73) Assignees: QING DING PRECISION ELECTRONICS (HUAIAN) CO., LTD, Huai an (CN); Avary Holding (Shenzhen) Co., Limited, Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 495 days.

(21) Appl. No.: 18/125,684

(22) Filed: Mar. 23, 2023

(65) Prior Publication Data

US 2024/0170301 A1     May 23, 2024

(30) Foreign Application Priority Data

Nov. 22, 2022     (CN) .......................... 202211469490.0

(51) Int. Cl.
| | |
|---|---|
| *H10W 70/05* | (2026.01) |
| *H05K 1/09* | (2006.01) |
| *H05K 1/185* | (2026.01) |
| *H05K 3/321* | (2026.01) |
| *H10W 90/00* | (2026.01) |

(52) U.S. Cl.
CPC ............ *H10W 70/05* (2026.01); *H05K 1/092* (2013.01); *H05K 1/185* (2013.01); *H05K*

*3/321* (2013.01); *H10W 70/093* (2026.01); *H10W 90/701* (2026.01)

(58) Field of Classification Search
CPC ............. H01L 21/4857; H01L 21/4853; H01L 23/49811; H05K 1/092; H05K 1/185; H05K 3/321; H05K 3/4046; H05K 3/4697; H05K 3/4682; H05K 1/11; H05K 3/4614
See application file for complete search history.

(56) References Cited

U.S. PATENT DOCUMENTS

| | | | | |
|---|---|---|---|---|
| 2014/0125372 A1* | 5/2014 | Fukasawa | ................ | G01R 3/00 |
| | | | | 324/756.03 |
| 2015/0137849 A1* | 5/2015 | Horiuchi | .................. | G01R 3/00 |
| | | | | 29/842 |

FOREIGN PATENT DOCUMENTS

| | | |
|---|---|---|
| TW | 200941681 A | 10/2009 |
| TW | 201543586 A | 11/2015 |

* cited by examiner

*Primary Examiner* — Steven B Gauthier
*Assistant Examiner* — Marc-Anthony Armand
(74) *Attorney, Agent, or Firm* — ScienBiziP, P.C.

(57) ABSTRACT

A packaging substrate includes a circuit board defining a through groove. The circuit board includes an insulating body and a first wiring layer formed on the insulating body. A colloid is formed in the through groove. The packaging substrate further includes at least one lead. Each lead includes a lead body and a lead terminal connected to an end of the lead body. The lead terminal protrudes from the colloid. Another end of the lead body away from the lead terminal is electrically connected to the circuit board, and the colloid covering the lead body.

10 Claims, 16 Drawing Sheets

1000

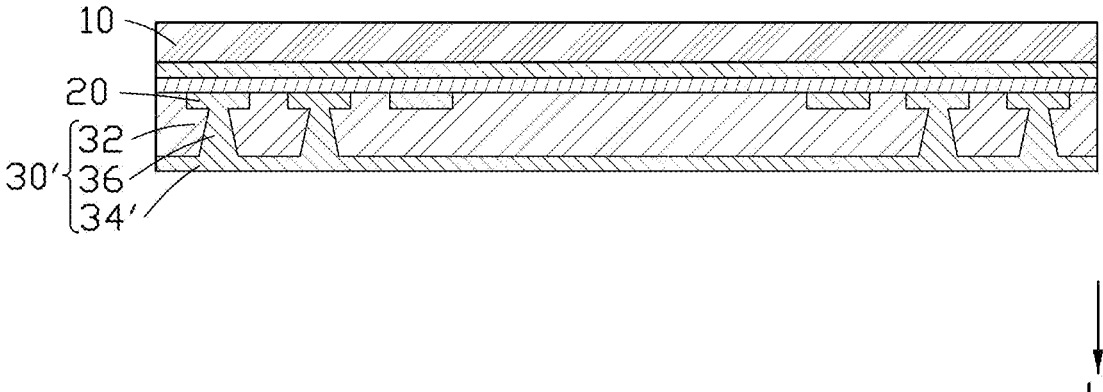
FIG. 3
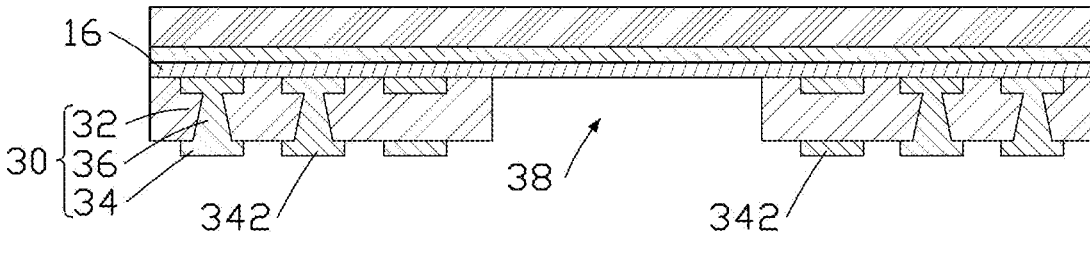
FIG. 4

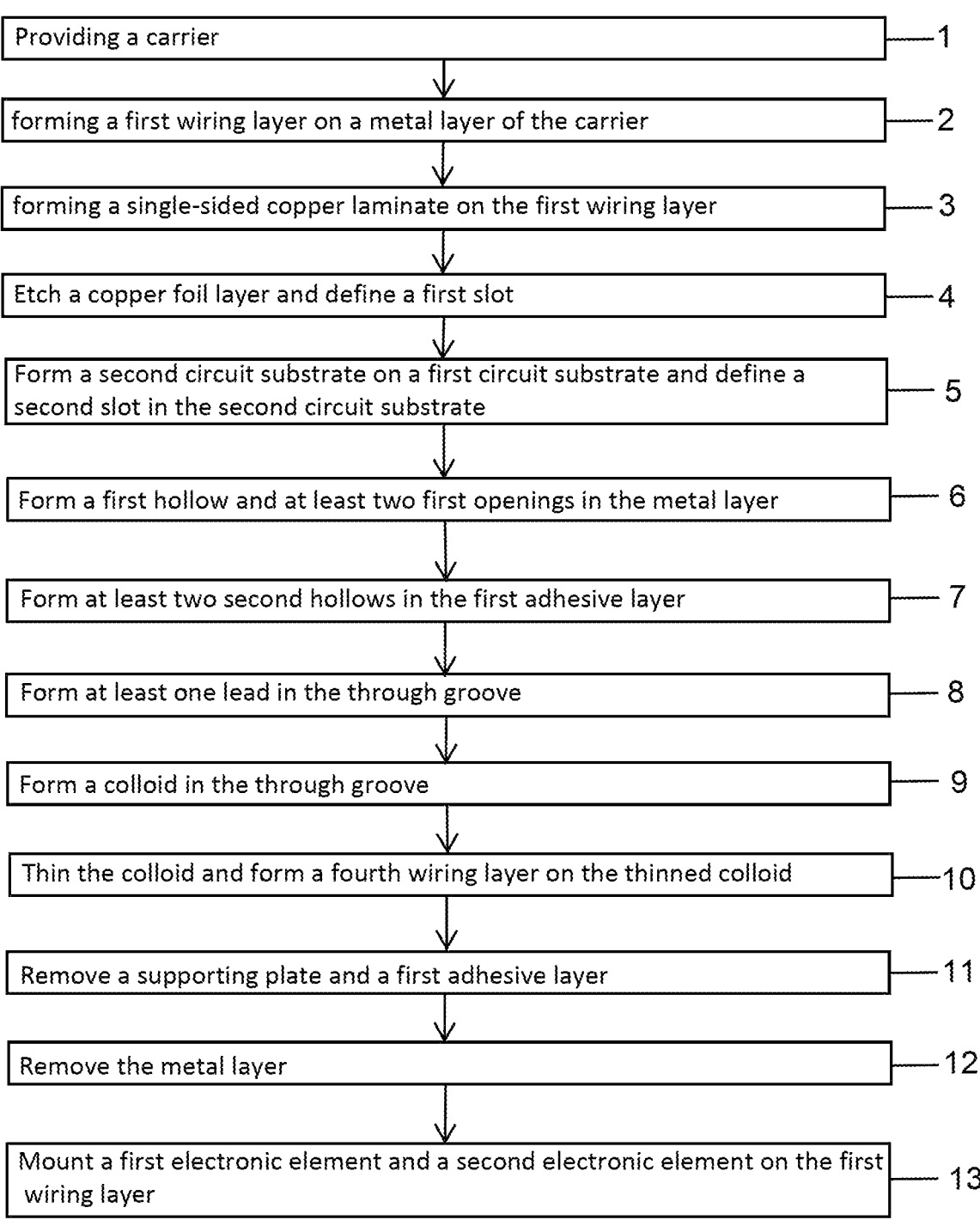

| | |
|---|---|
| Providing a carrier | 1 |
| forming a first wiring layer on a metal layer of the carrier | 2 |
| forming a single-sided copper laminate on the first wiring layer | 3 |
| Etch a copper foil layer and define a first slot | 4 |
| Form a second circuit substrate on a first circuit substrate and define a second slot in the second circuit substrate | 5 |
| Form a first hollow and at least two first openings in the metal layer | 6 |
| Form at least two second hollows in the first adhesive layer | 7 |
| Form at least one lead in the through groove | 8 |
| Form a colloid in the through groove | 9 |
| Thin the colloid and form a fourth wiring layer on the thinned colloid | 10 |
| Remove a supporting plate and a first adhesive layer | 11 |
| Remove the metal layer | 12 |
| Mount a first electronic element and a second electronic element on the first wiring layer | 13 |

FIG. 14

PACKAGING STRUCTURE, PACKAGING SUBSTRATE, AND MANUFACTURING METHOD OF THE PACKAGING STRUCTURE

FIELD

The subject matter herein generally relates to circuit boards, and more particularly, to a packaging structure, a packaging substrate, and a manufacturing method of the packaging substrate.

BACKGROUND

Packaging structures may include package substrates and electronic elements. The package structure may include I/O pads, and the electronic elements may be mounted on the pads through connecting members (such as solder balls). However, different sizes of the pads may be required for mounting different types of electronic elements, and accordingly, different sizes of the connecting members may be also needed. Thus, the connection between the package substrate and different types of electronic elements is not flexible.

Therefore, there is room for improvement within the art.

BRIEF DESCRIPTION OF THE DRAWINGS

Implementations of the present disclosure will now be described, by way of embodiments, with reference to the attached figures.

FIG. 3 is a cross-sectional view showing a single-sided copper laminate formed on the first wiring layer of FIG. 2.

FIG. 4 is a cross-sectional view showing a first slot formed on the single-sided copper laminate of FIG. 3.

FIG. 14 is a flowchart of a manufacturing method of a package structure according to an embodiment of the present application.

DETAILED DESCRIPTION

Figure 1:
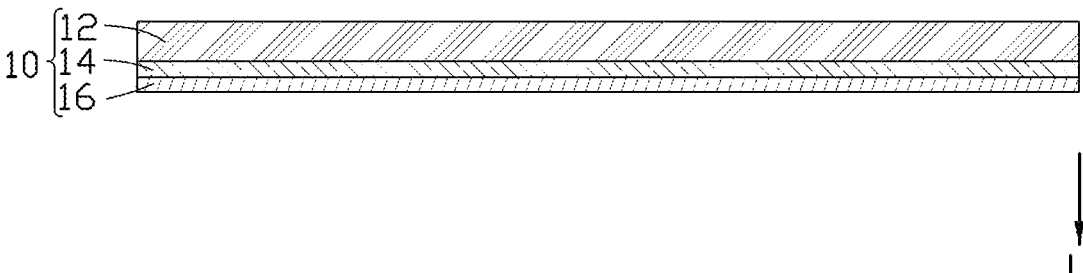
FIG. 1 is a cross-sectional view of a carrier according to an embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 14 illustrates a flowchart of a manufacturing method of a packaging structure 1000 in accordance with an embodiment. The method is provided by way of embodiments, as there are a variety of ways to carry out the method. Each block shown in FIG. 14 represents one or more processes, methods, or subroutines carried out in the method. Furthermore, the illustrated order of blocks can be changed. Additional blocks may be added or fewer blocks may be utilized, without departing from this disclosure. The method can begin at block 1.

Block 1, referring to FIG. 1, a carrier 10 is provided, which includes a supporting plate 12, a first adhesive layer 14, and a metal layer 16 stacked along a thickness direction L of the carrier 10.

In at least one embodiment, the first adhesive layer 14 may be made of polyethylene terephthalate (PET) or polytetrafluoroethylene (PTFE). The metal layer 16 may be made of copper, silver, nickel, or another conductive material.

Figure 2:
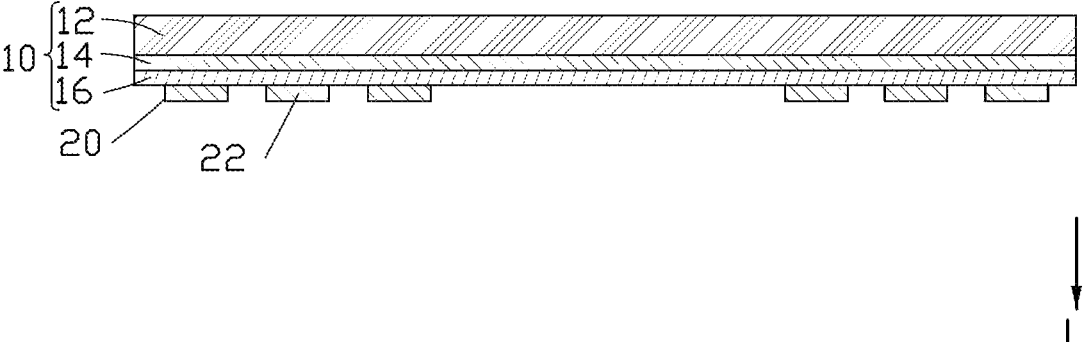
FIG. 2 is a cross-sectional view showing a first wiring layer formed on the carrier of FIG. 1.

Block 2, referring to FIG. 2, a first wiring layer 20 is formed on the metal layer 16. The first wiring layer 20 includes a number of first pads 22 spaced from each other.

Block 3, referring to FIG. 3, a single-sided copper laminate 30' is formed on the first wiring layer 20. The single-sided copper laminate 30' includes a first dielectric layer 32 covering the first wiring layer 20 and a copper foil layer 34' formed on the first dielectric layer 32.

In at least one embodiment, a first conductive body 36 is also formed in the single-sided copper laminate 30'. The first conductive body 36 electrically connects the first wiring layer 20 to the copper foil layer 34'.

Block 4, referring to FIG. 4, the copper foil layer 34' is etched to form a second wiring layer 34. A first slot 38 is formed in the first dielectric layer 32. The first slot 38 extends through the first dielectric layer 32 along the thickness direction L. The metal layer 16 is partially exposed from the first slot 38.

The first dielectric layer 32, the second wiring layer 34, and the first conductive body 36 constitute a first circuit substrate 30. The second wiring layer 34 includes a number of second pads 342 spaced from each other.

Figure 5:
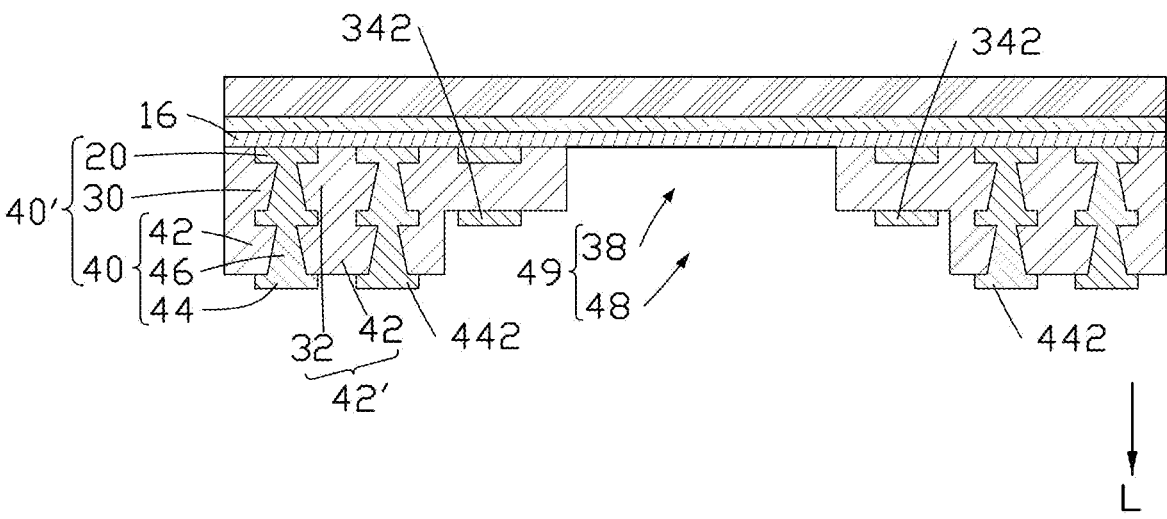
FIG. 5 is a cross-sectional view showing a second circuit substrate formed on a first circuit substrate of FIG. 4.

Block S5, referring to FIG. 5, a second circuit substrate 40 is formed on the first circuit substrate 30. The second circuit substrate 40 defines a second slot 48. The second slot 48 extends through the second circuit substrate 40 and connects to the first slot 38. The first slot 38 and the second slot 48 cooperatively form a through groove 49.

In at least one embodiment, the second circuit substrate 40 includes a second dielectric layer 42 formed on the second wiring layer 34, a third wiring layer 44 formed on the second dielectric layer 42, and a second conductive body 46 extending through the second dielectric layer 42. The second conductive body 46 electrically connects the second wiring layer 34 to the third wiring layer 44. The third wiring layer 44 includes a number of third pads 442 spaced from each other. The first wiring layer 20, the first circuit substrate 30, and the second circuit substrate 40 cooperatively form a circuit board 40'. The first dielectric layer 32 and the second dielectric layer 42 cooperatively form an insulating body 42'.

In this embodiment, a width of the second slot 48 is greater than a width of the first slot 38. An orthogonal projection of the second slot 48 on the first circuit substrate 30 totally covers the first slot 38, so that the second slot 48 and the first slot 38 form a stepped structure. A portion of the first dielectric layer 32 and at least one of the second pads 342 are exposed from the second slot 48.

Figure 6:
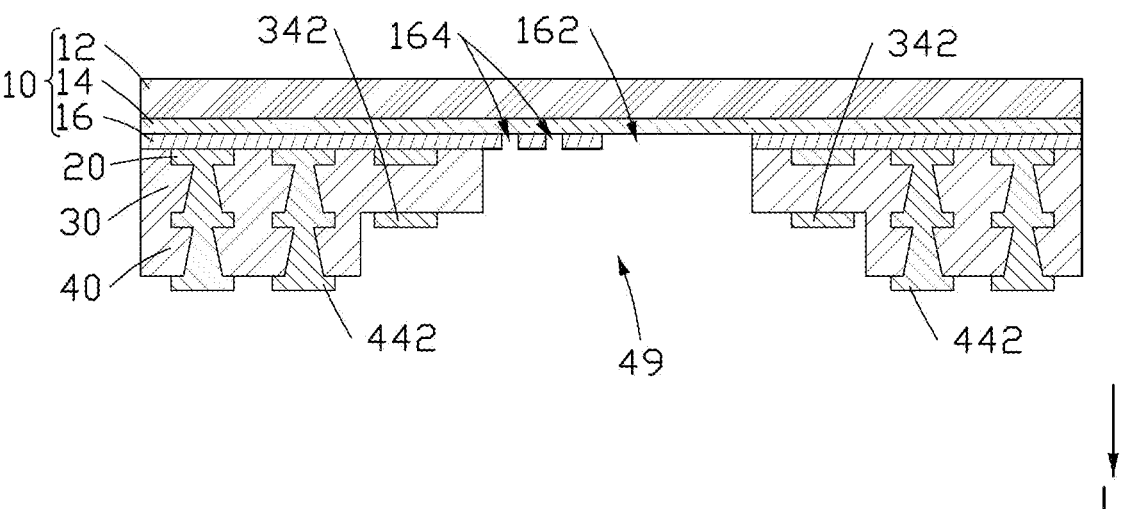
FIG. 6 is a cross-sectional view showing a first hollow area and two first openings formed in a metal layer of FIG. 5.

Block S6, referring to FIG. 6, a first hollow area 162 and at least two first openings 164 are formed in the metal layer 16 exposed from the first slot 38. The first adhesive layer 14 is partially exposed from the first hollow area 162 and the first openings 164.

Each of the first hollow area 162 and the first openings 164 may be formed by etching or laser drilling. Each of the first openings 164 may extend through the entire metal layer 16 or partially extend through the metal layer 16.

Figure 7:
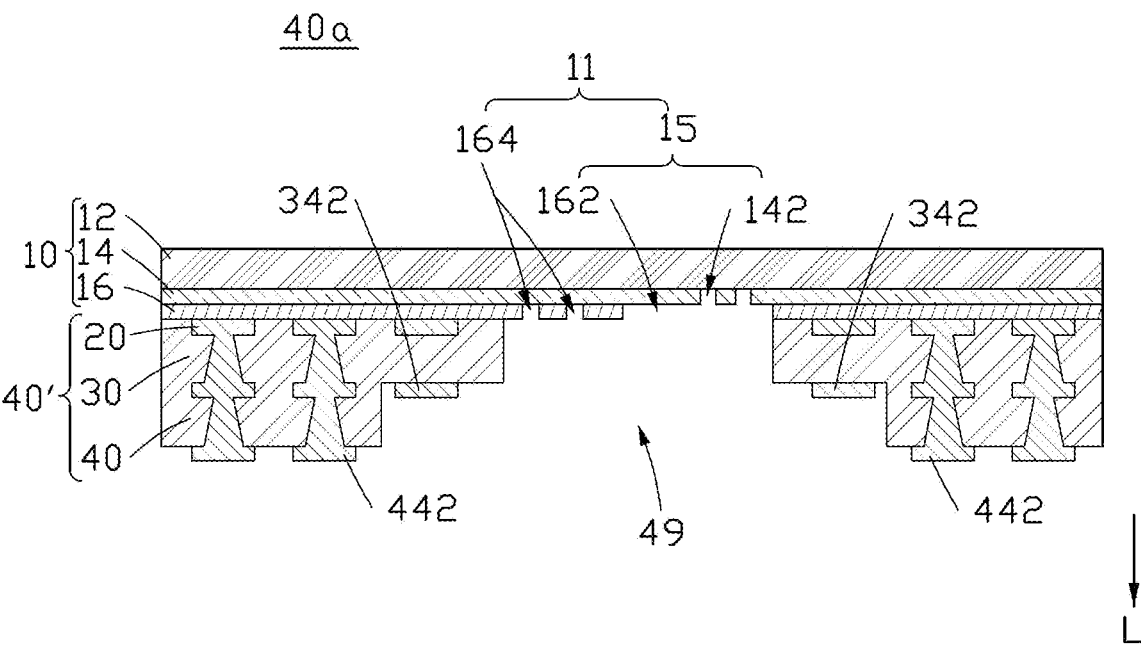
FIG. 7 is a cross-sectional view showing a second hollow area formed in a first adhesive layer of FIG. 6 to obtain an intermediate body.

Block 7, referring to FIG. 7, at least two second hollow areas 142 are formed in the first adhesive layer 14 exposed from the first hollow area 162. Then, an intermediate body 40a is obtained.

The first hollow area 162 and the second hollow areas 142 communicate with each other. The first hollow area 162 and the second hollow areas 142 cooperatively form a second opening 15. The second opening 15 and the first openings 164 cooperatively form an opening area 11. A width of the first hollow area 162 is greater than a total width of the second hollow areas 142.

The second hollow areas 142 may be formed by etching or laser drilling.

Figure 8:
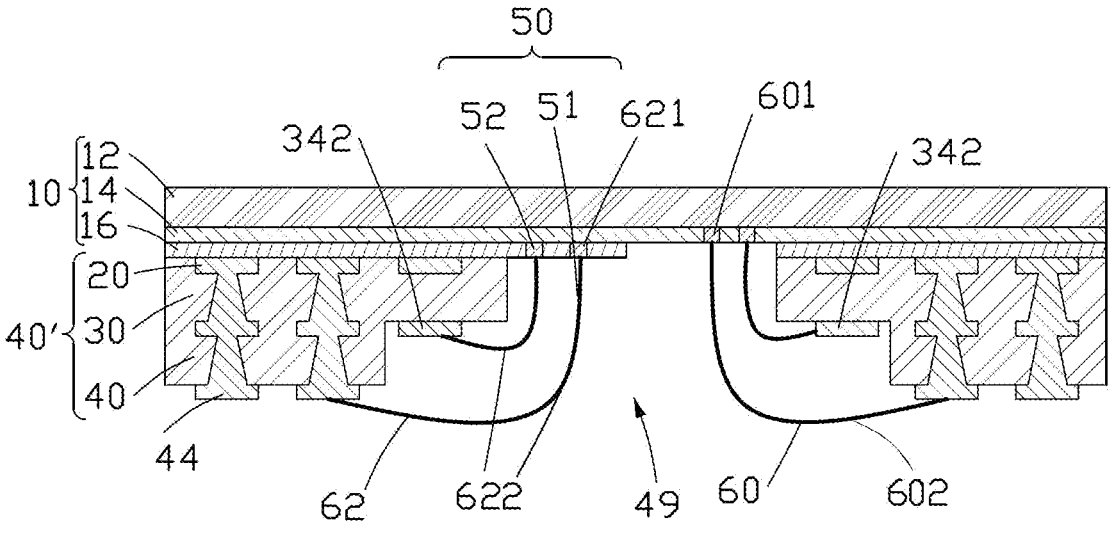
FIG. 8 is a cross-sectional view showing leads formed in a through groove of FIG. 7.

Block 8, referring to FIG. 8, at least one lead 50 is formed in the through groove 49. Each lead 50 includes a lead body 51 and a lead terminal 52 connected to an end of the lead body 51. The lead terminal 52 is formed in the opening area 11. Another end of the lead body 51 away from the lead terminal 52 is electrically connected to the circuit board 40'.

In at least one embodiment, a spherical bonding process may be used to melt an end of the lead 50 into a ball body under electric spark. The ball body is placed in the opening area 11 under a bonding pressure. The opening area 11 limits and shapes the ball body into the lead terminal 52. Another end of the lead 50 away from the lead terminal 52 is melted to form another ball body, and the ball body is compressed under another bonding pressure to electrically connect the circuit board 40'.

In at least one embodiment, the at least one lead 50 includes two first leads 60 and two second leads 62. Each first lead 60 includes a first lead body 602 and a first lead terminal 601 connected to an end of the first lead body 602. Each second lead 62 includes a second lead body 622 and a second lead terminal 621 connected to an end of the second lead body 622. The two first lead terminals 601 are respectively formed in the second hollow area 142. The two second lead terminals 621 are respectively formed in the first openings 164. Another end of one first lead body 602 opposite to the first lead terminal 601 is electrically connected to the third wiring layer 44, and another end of another first lead body 602 opposite to the first lead terminal 601 is electrically connected to the second wiring layer 34. Another end of one second lead body 622 opposite to the second lead terminal 621 is electrically connected to the third wiring layer 44, and another end of another second lead body 622 opposite to the second lead terminal 621 is electrically connected to the second wiring layer 34.

Figure 9:
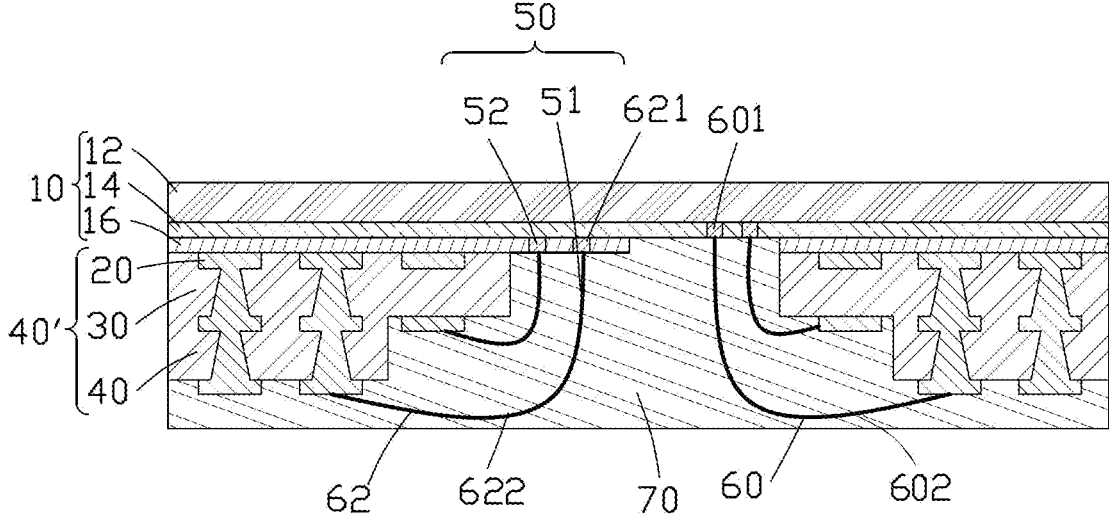
FIG. 9 is a cross-sectional view showing a colloid filled in the through groove of FIG. 8.

Block 9, referring to FIG. 9, a colloid 70 is formed on the third wiring layer 44 and further filled in the through groove 49. The colloid 70 covers the lead 50.

Figure 13:
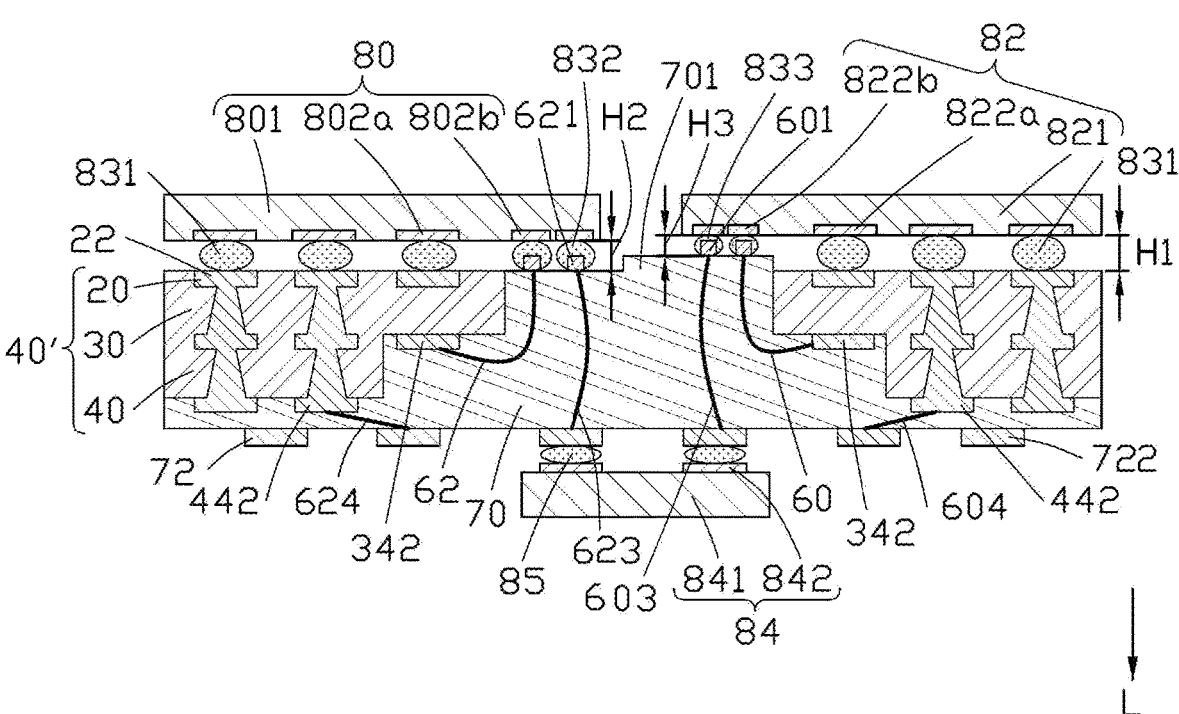
FIG. 13 is a cross-sectional view showing electronic elements mounted on the packaging substrate of FIG. 12 to obtain a packaging structure.

In at least one embodiment, the colloid 70 may include a material with low coefficient of thermal expansion, thereby reducing the warpage of the substrate generated during a subsequent process of mounting electronic elements (see FIG. 13). For example, the colloid 70 may be epoxy resin containing alumina or silica particles.

Figure 10:
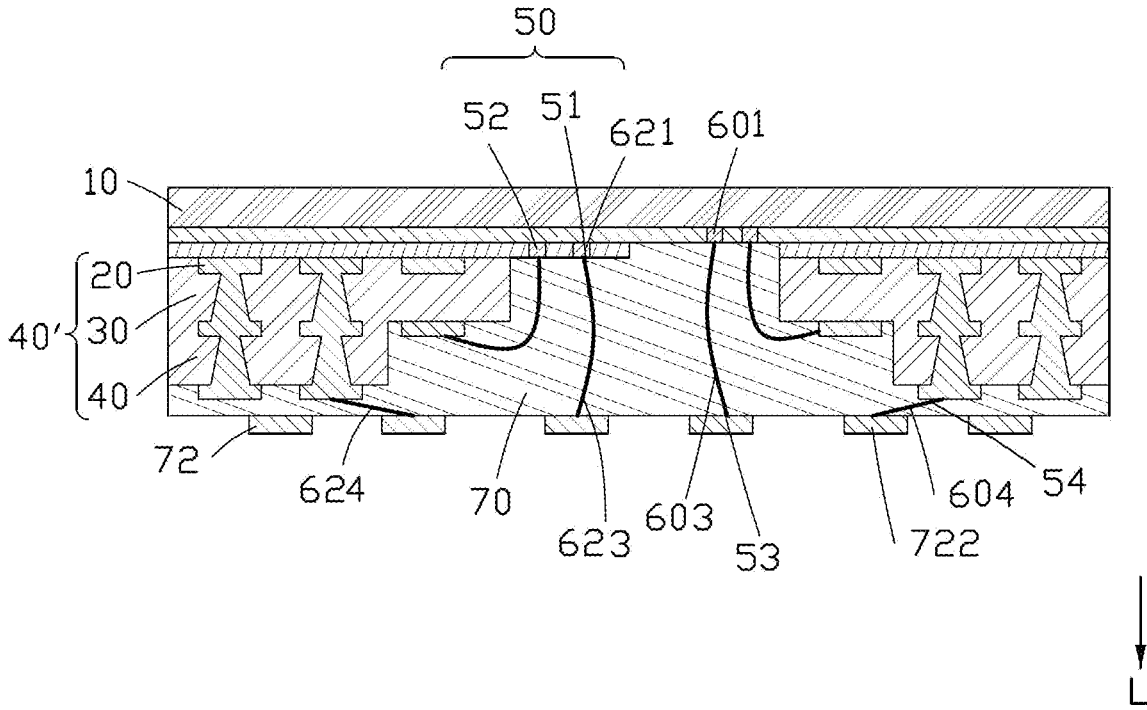
FIG. 10 is a cross-sectional view showing a fourth wiring layer formed on the colloid of FIG. 9.

Block 10, referring to FIG. 10, the colloid 70 is thinned, and one of the at least one lead 50 is partially removed to form a first lead portion 53 and second lead portion 54 separated from each other. A fourth wiring layer 72 is then formed on the thinned colloid 70.

The first lead portion 53 includes the lead terminal 52, and the fourth wiring layer 72 is electrically connected to another end of the first lead portion 53 away from the lead terminal 52. The second lead portion 54 electrically connects the fourth wiring layer 72 to the third wiring layer 44.

In at least one embodiment, the fourth wiring layer 72 includes a number of fourth pads 722 spaced from each other. One of the first leads 60 is partially removed to form a first separating portion 603 and a second separating portion 604, and one of the second leads 62 is partially removed to form a third separating portion 623 and a fourth separating portion 624. An end of the first separating portion 603 away from the first lead terminal 601 is electrically connected to the fourth pad 722, and the second separating portion 604 is electrically connected to the third pad 442 and the fourth pad 722. An end of the third separating portion 623 away from the second lead terminal 621 is electrically connected to the fourth pad 722, and the fourth separating portion 624 is electrically connected to the third pad 442 and the fourth pad 722.

Figure 11:
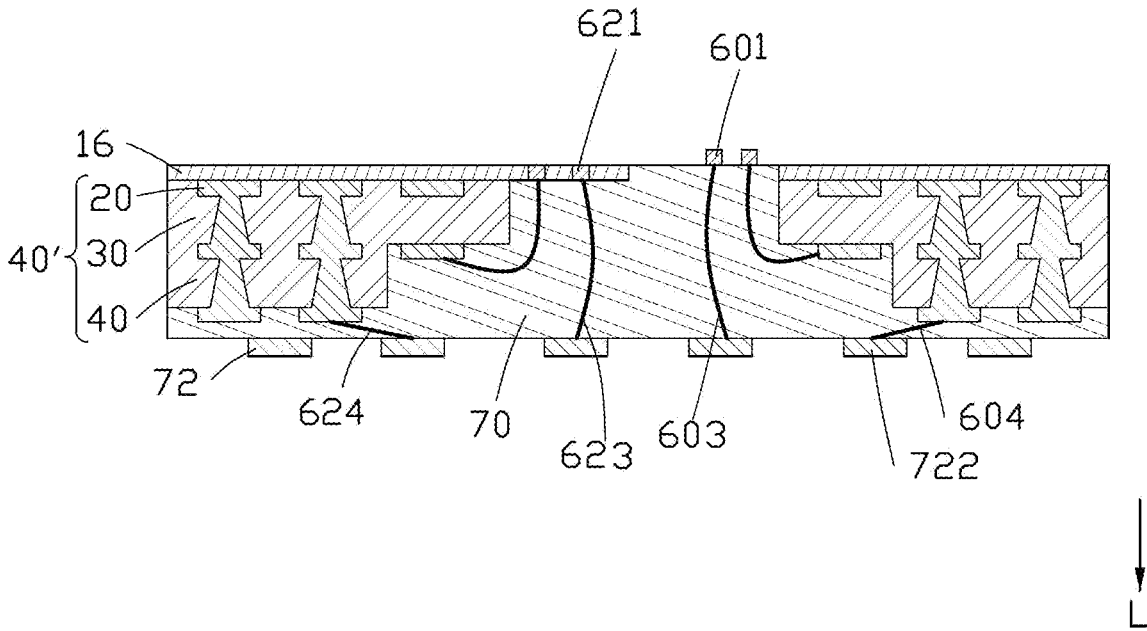
FIG. 11 is a cross-sectional view showing a supporting plate and a first adhesive layer of FIG. 10 removed.

Block 11, referring to FIG. 11, the supporting plate 12 and the first adhesive layer 14 are removed to expose the first lead terminals 601 formed in the second hollow areas 142.

Figure 12:
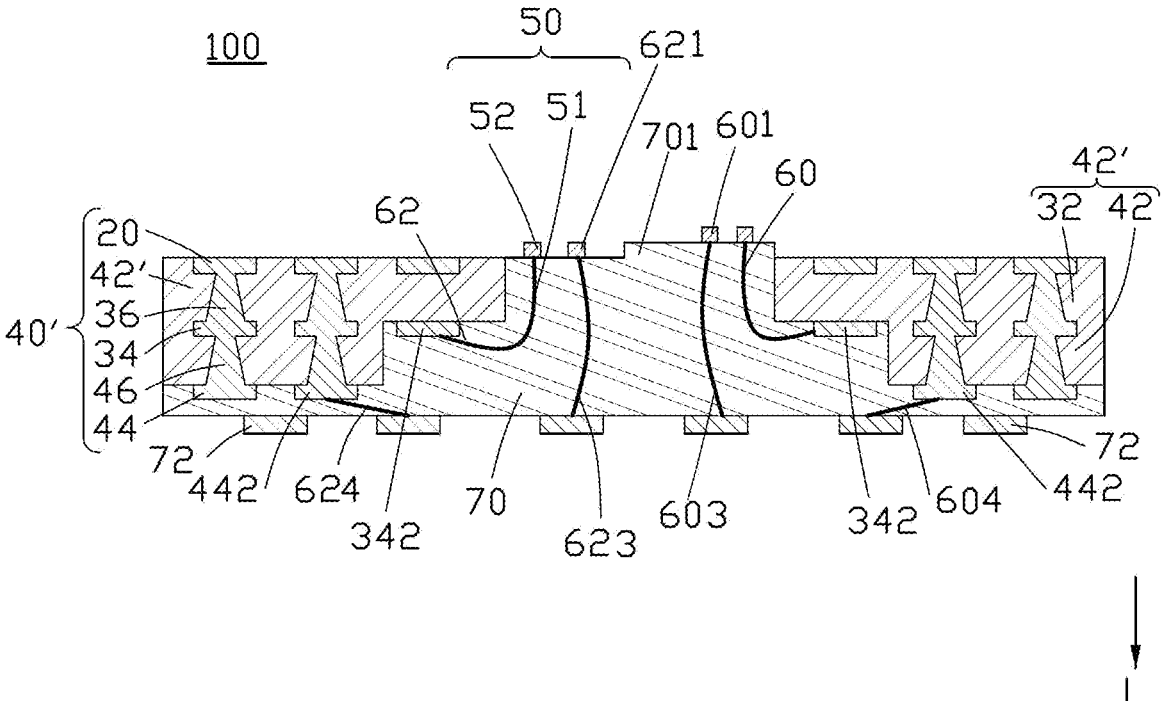
FIG. 12 is a cross-sectional view showing the metal layer of FIG. 11 removed to obtain a packaging substrate.

Block 12, referring to FIG. 12, the metal layer 16 is removed to expose the first wiring layer 20 and the second lead terminal 621 formed in the first opening 164. Then, the colloid 70 at the first hollow area 162 forms a first protrusion 701. Then, the packaging substrate 100 is obtained.

The first protrusion 701 protrudes from the first wiring layer 20 of the circuit board 40'. The first lead terminal 601 is formed on a surface of the first protrusion 701 away from the circuit board 40'.

Block 13, referring to FIG. 13, a first electronic element 80 and a second electronic element 82 are mounted on the first wiring layer 20 on the packaging substrate 100. Then, the packaging structure 1000 is obtained.

The first electronic element 80 includes a first main body 801 and first connection pads 802a and 802b each electrically connecting the first main body 801. A first connecting member 831 is arranged between the first connection pad 802a and the first wiring layer 20. A second connecting member 832 is arranged between the first connection pad 802b and the colloid 70. The first electronic element 80 is electrically connected to the packaging substrate 100 through the first connecting member 831 and the second connecting member 832. The second electronic element 82 includes a second main body 821 and second connection pads 822a and 822b each electrically connecting the second main body 821. Another first connecting member 831 is arranged between the second connection pad 822a and the first wiring layer 20. The connection pad 822b faces the first protrusion 701. A third connecting member 833 is arranged between the second connection pad 822b and the first protrusion 701. The second electronic element 82 is electrically connected to the packaging substrate 100 through the first connecting member 831 and the third connecting member 833.

Since the first protrusion 701 protrudes from the circuit board 40', a height H3 of the third connecting member 833 is less than a height H1 of the first connecting member 831. The height H1 of the first connecting member 831 is substantially equal to a height H2 of the second connecting member 832. Thus, the first electronic element 80 and the second electronic element 82 can be on a same horizontal plane.

In at least one embodiment, a third electronic element 84 may further be formed on the fourth wiring layer 72. The third electronic element 84 includes a third main body 841 and two third connection pad 842 each electrically connected to the third main body 841. A fourth connecting member 85 is arranged between the third connection pad 842 and the fourth pad 722. The third element 84 is electrically connected to the packaging substrate 100 through the fourth connecting member 85.

In at least one embodiment, each of the first connecting member 831, the second connecting member 832, the third connecting member 833, and the fourth connecting member 85 may be a solder ball.

Referring to FIGS. 12 and 13, a packaging structure 1000 is provided according to an embodiment of the present disclosure. The packaging structure 1000 includes a packaging substrate 100, a first electronic element 80, a second electronic element 82, a third electronic element 84, a first connecting member 831, a second connecting member 832, a third connecting member 833, and a fourth connecting member 85.

The packaging substrate 100 includes a circuit board 40', at least one lead 50, a colloid 70, and a fourth wiring layer 72. The circuit board 40' defines a through groove 49 extending therethrough. The colloid 70 is formed in the through groove 49. Each lead 50 includes a lead body 51 and a lead terminal 52 connected to an end of the lead body 51. The lead terminal 52 protrudes from the colloid 70. The colloid 70 covers the lead body 51.

The at least one lead 50 includes two first leads 60 and two second leads 62. Each first lead 60 includes a first lead body 602 and a first lead terminal 601 connected to an end of the first lead body 602. Each second lead 62 includes a second lead body 622 and a second lead terminal 621 connected to an end of the second lead body 622. The colloid 70 has a first protrusion 701 protruding from the circuit board 40'. The first lead terminal 601 and the second lead terminal 621 are formed on the circuit board 40' and spaced apart from each other.

The first lead terminal 601 is formed on the first protrusion 701. The second lead terminal 621 is formed on a surface of the colloid 70 that is flush with the circuit board 40'. The fourth wiring layer 72 is formed on a surface of the colloid 70 away from the first protrusion 701. The fourth wiring layer 72 includes a number of fourth pads 722 spaced from each other.

The circuit board 40' includes an insulating body 42', a first wiring layer 20, a second wiring layer 34, a first conductive body 36, a second conductive body 46, and a third wiring layer 44. The first wiring layer 20, the second wiring layer 34, the first conductive body 36, and the second conductive body 46 are all formed in the insulating body 42'. The third wiring layer 44 is formed on a surface of the insulating body 42'. A surface of the first wiring layer 20 is substantially flush with a surface of the insulating body 42'. The first conductive body 36 electrically connects the first wiring layer 20 to the second wiring layer 34. The second conductive body 46 electrically connects the second wiring layer 34 to the third wiring layer 44. The first wiring layer 20 includes a number of first pads 22 spaced from each other. The second wiring layer 34 includes a number of second pads 342 spaced from each other. The third wiring layer 44 includes a number of third pads 442 spaced from each other. The colloid 70 covers the third pads 442 and a portion of the second pads 342.

In at least one embodiment, along the thickness direction L of the circuit board 40', the through groove 49 includes a first slot 38 and a second slot 48 connected to the first slot 38. A width of the second slot 48 is greater than a width of the first slot 38. At least two second pads 342 are exposed from the second slot 48 and covered by the colloid 70.

One of the first leads 60 includes a first separating portion 603 and a second separating portion 604. One of the second leads 62 includes a third separating portion 623 and a fourth separating portion 624. An end of the first separating portion 603 away from the first lead terminal 601 is electrically connected to one fourth pad 722. The second separating portion 604 is electrically connected to one third pad 442 and one fourth pad 722. An end of the third separating portion 623 away from the second lead terminal 621 is electrically connected to one fourth pad 722. The fourth separating portion 624 is electrically connected to one third pad 442 and one fourth pad 722.

The first electronic element 80 includes a first main body 801 and first connection pads 802a and 802b each electrically connecting the first main body 801. A first connecting member 831 is arranged between the first connection pad 802a and the first pad 22. A second connecting member 832 is arranged between the first connection pad 802b and the second lead terminal 621. The first electronic element 80 is electrically connected to the packaging substrate 100 through the first connecting member 831 and the second connecting member 832. The second electronic element 82 includes a second main body 821 and second connection pads 822a and 822b each electrically connecting the second main body 821. Another first connecting member 831 is arranged between the second connection pad 822a and the first pad 22. The second connection pad 821a faces towards the first protrusion 701. A third connecting member 833 is arranged between the second connection pad 822b and the first lead terminal 601. The second electronic element 82 is electrically connected to the packaging substrate 100 through the first connecting member 831 and the third connecting member 833.

Since the first protrusion 701 protrudes from the circuit board 40', a height H3 of the third connecting member 833 is less than a height H1 of the first connecting member 831. The height H1 of the first connecting member 831 is approximately equal to a height H2 of the second connecting member 832. Thus, the first electronic element 80 and the second electronic element 82 can be on a same horizontal plane.

The third electronic element 84 includes a third main body 841 and a third connection pad 842 electrically connected to the third main body 841. A fourth connecting member 85 is arranged between the third connection pad 842 and the fourth pad 722. The third element 84 is electrically connected to the packaging substrate 100 through the fourth connecting member 85.

In the present disclosure, the lead terminal 52 is used in the packaging structure 1000 to replace an existing solder pad, which improves the interconnection density of the packaging substrate 100. The size of the lead terminal 52 or the distance between two lead terminals 52 can be changed, which realizes a flexible connection between the package substrate 100 and the electronic elements. The colloid 70 has the first protrusion 701 and the first lead terminal 601 is formed on the first protrusion 701, which further improves the versatility of the packaging structure 1000 and is suitable for the connection of various electronic elements. The size of the third connecting member 833 is small, which further improves the interconnection density.

Moreover, the first lead terminal 601 and the second lead terminal 621 are electrically connected to a wiring layer (such as the fourth wiring layer 72) respectively through the first lead 60 and the second lead 62. Thus, a signal transmission path of the first and second lead terminals is shortened, which further reduces the parasitic capacitance.

In addition, the first slot 38 and the second slot 48 cooperatively form the through groove 49 that has a stepped structure, and the second pads 342 are partially exposed from the second slot 48. Thus, the second lead 62 can electrically connect the second wiring layer 34, which reduces the requirement for the wiring density of the packaging substrate 100.

In addition, the colloid 70 is made of a material with low coefficient of thermal expansion, which reduces the warpage of the substrate during the process of mounting electronic elements.

Figure 15:
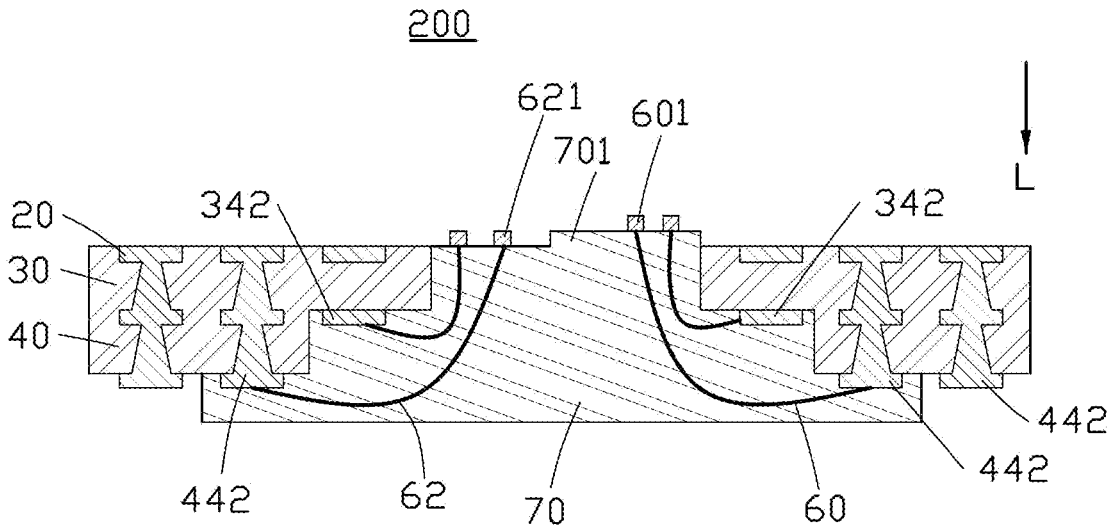
FIG. 15 is a cross-sectional view of a packaging substrate according to another embodiment of the present application.

A manufacturing method of a packaging substrate 200 in accordance with another embodiment is provided. Referring to FIG. 15, different from the manufacturing method of the packaging substrate 100, block 10 is omitted from the manufacturing method of the packaging substrate 200. That is, the colloid 70 is not thinned.

In the packaging substrate 200, an end of one first lead 60 away from the first lead terminal 601 is electrically connected to the third pad 442, and an end of another first lead 60 away from the first lead terminal 601 is electrically connected to the second pad 342. An end of the second lead 62 away from the second lead terminal 621 is electrically connected to the third pad 442, and an end of another second lead 62 away from the second lead terminal 621 is electrically connected to the second pad 342. The colloid 70 covers a portion of the third pads 442.

Figure 16:
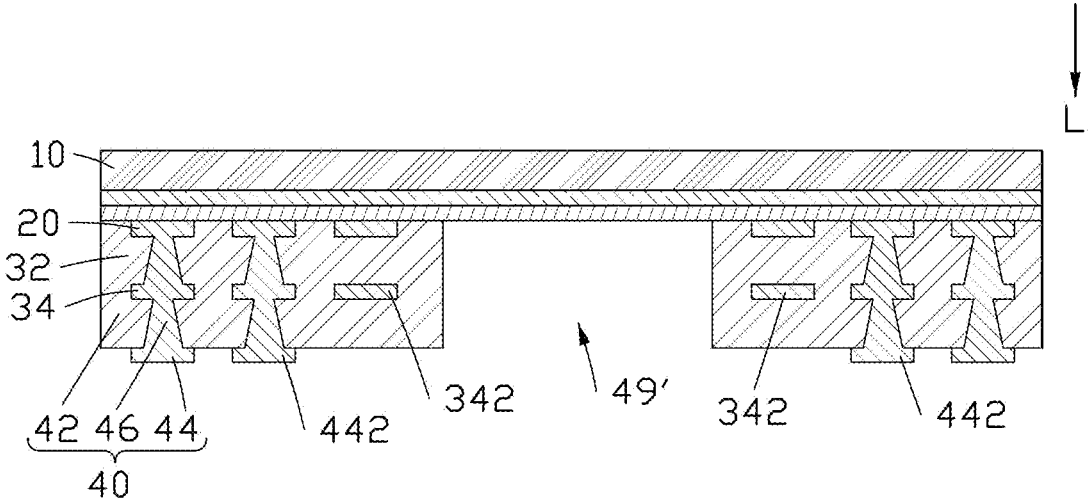
FIG. 16 is a cross-sectional view showing a first circuit substrate and a second circuit substrate formed on the carrier of FIG. 2, and a through groove formed in the first circuit substrate and the second circuit substrate.
Figure 17:
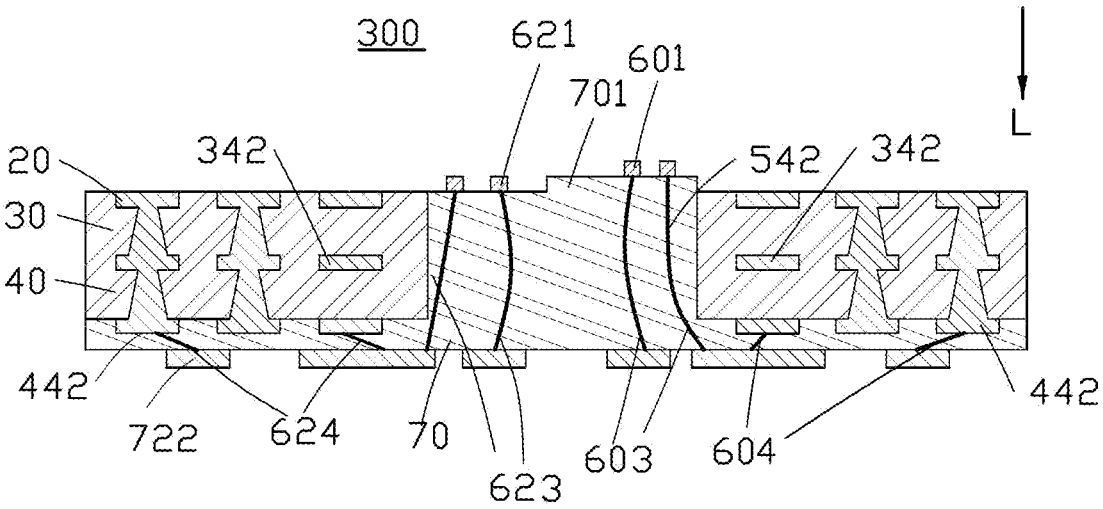
FIG. 17 is a cross-sectional view of a packaging substrate obtained from the structure of FIG. 16.

A manufacturing method of a packaging substrate 300 in accordance with yet another embodiment is provided. Referring to FIGS. 16 and 17, different from the manufacturing method of the packaging substrate 100, during blocks 4 and 5, the first circuit substrate 30 and the second circuit substrate 40 are first stacked, and then the through groove 49' is defined through the first circuit substrate 30 and the second circuit substrate 40. At this time, the through groove 49' does not have a stepped structure.

Furthermore, at block 10, after thinning the colloid 70, each of the two first leads 60 is partially removed, and each of the two second leads 62 is partially removed at the same time. Then, each second lead 62 is divided to form a third separating portion 623 and a fourth separating portion 624. An end of the third separating portion 623 away from the second lead terminal 621 is electrically connected to the fourth pad 722. The fourth separating portion 624 is electrically connected to the third pad 442 and the fourth pad 722.

Figure 18:
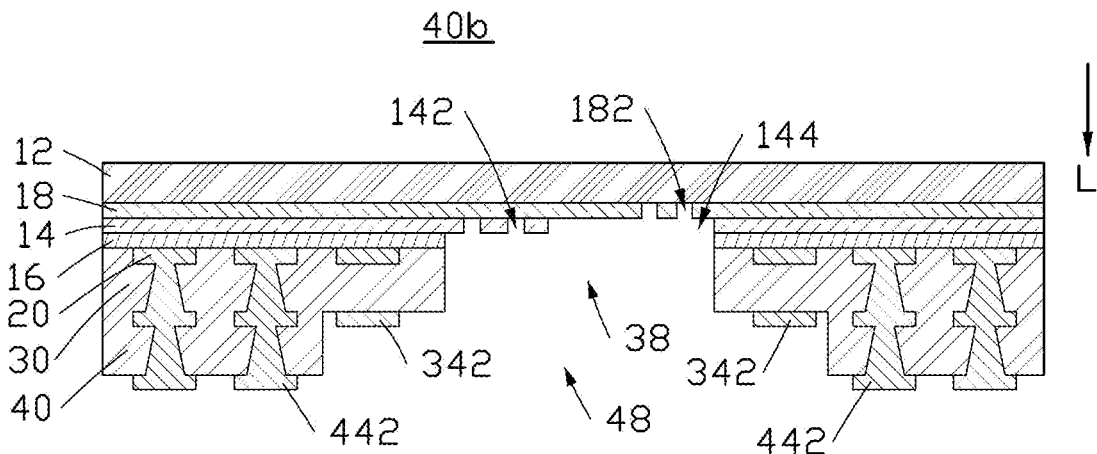
FIG. 18 is a cross-sectional view of an intermediate body according to yet another embodiment of the present application.
Figure 19:
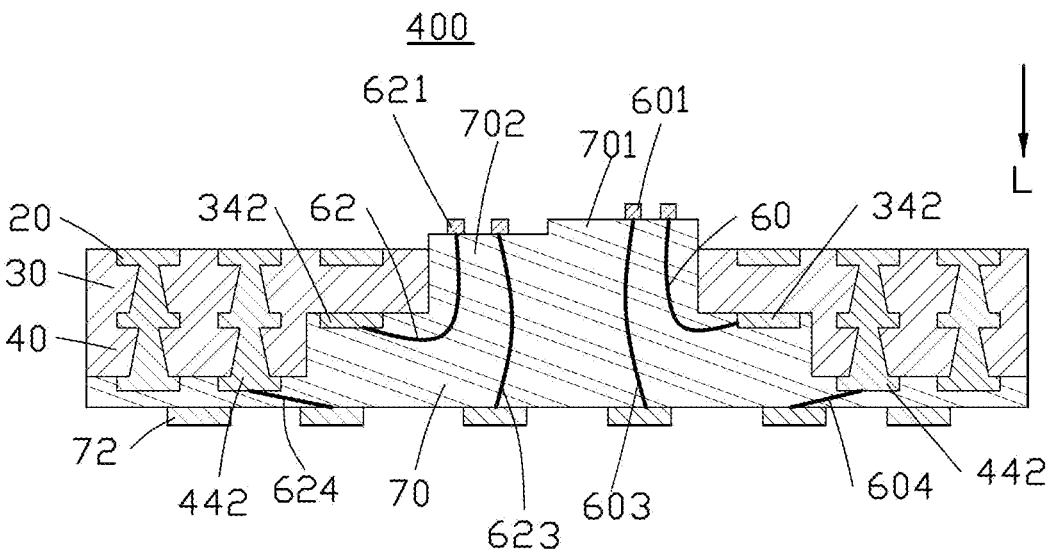
FIG. 19 is a cross-sectional view of a packaging substrate obtained from the structure of FIG. 18.

A manufacturing method of a packaging substrate 400 in accordance with yet another embodiment is provided. Referring to FIGS. 18 and 19, different from the manufacturing method of the packaging substrate 100, the carrier 10 further includes a second adhesive layer 18 sandwiched between the first adhesive layer 14 and the supporting plate 12.

At block 4, the first slot 38 extends through the first dielectric layer 32 and the metal layer 16. At block 6, the first hollow area 144 and the first openings 164 also extend through the first adhesive layer 14. At block 7, at least two second hollow areas 182 are defined at the bottom of the first hollow area 144, and the second hollow areas 182 also extend through the second adhesive layer 18, thereby obtaining an intermediate body 40b. Thus, at block 12, after removing the metal layer 16, a first protrusion 701 and a second protrusion 702 are both formed at the colloid 70. The first lead terminal 601 is formed on the first protrusion 701, and the second lead terminal 621 is formed on the second protrusion 702. The height of the first protrusion 701 is higher than the height of the second protrusion 702.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A packaging substrate comprising:
    a circuit board defining a through groove, the circuit board further comprising an insulating body and a first wiring layer formed on the insulating body;
    a colloid formed in the through groove; and
    at least one lead each comprising a lead body and a lead terminal connected to an end of the lead body, the lead terminal protruding from the colloid, another end of the lead body away from the lead terminal being electrically connected to the circuit board, and the colloid covering the lead body;
    wherein the at least one lead comprises a first lead and a second lead, the first lead comprises a first lead body and a first lead terminal connected to an end of the first lead body, the second lead comprises a second lead body and a second lead terminal connected to an end of the second lead body, the first lead terminal and the second lead terminal are exposed from the colloid and spaced from each other;

wherein the colloid comprises a protrusion protrudes from the circuit board, the protrusion and the first wiring layer are on a same surface of the insulating body, and the first lead terminal is formed on the protrusion.

2. The packaging substrate according to claim 1, wherein the circuit board further comprises a second wiring layer formed in the insulating body, the through groove comprises a first slot and a second slot connected to the first slot, the first slot and the second slot are arranged along a thickness direction of the circuit board, a width of the second slot is larger than a width of the first slot, and the second wiring layer is partially exposed from the second slot; another end of the lead body away from the lead terminal is electrically connected to the second wiring layer.

3. The packaging substrate according to claim 1, wherein the circuit board further comprises a third wiring layer on another surface of the insulating body away from the first wiring layer, and another end of the lead body away from the lead terminal is electrically connected to the third wiring layer.

4. The packaging substrate according to claim 1, wherein the packaging substrate further comprises a fourth wiring layer, and the fourth wiring layer is formed on a surface of the filled colloid away from the lead terminal; the first lead body comprises a first separating portion and a second separating portion, the second lead body comprises a third separating portion and a fourth separating portion, an end of the first separating portion is connected to the first lead terminal, another end of the first separating portion is electrically connected to the fourth wiring layer; the second separating portion is electrically connected to the fourth wiring layer and the circuit board; an end of the third separating portion is connected to the second lead terminal, another end of the third separating portion is electrically connected to the fourth wiring layer; the fourth separating portion is electrically connected to the fourth wiring layer and the circuit board.

5. The packaging substrate according to claim 1, wherein the first wiring layer is embedded in the insulating body, and a surface of the first wiring layer away from the insulating body is flush with a surface of the insulating body.

6. A packaging structure comprising:

a packaging substrate comprising:

a circuit board defining a through groove, the circuit board comprising an insulating body and a first wiring layer formed on the insulating body;

a colloid formed in the through groove; and at least one lead each comprising a lead body and a lead terminal connected to an end of the lead body, the lead terminal protruding from the colloid, another end of the lead body away from the lead terminal being electrically connected to the circuit board, and the colloid covering the lead body;

an electronic element;

a first connecting member arranged between the electronic element and the circuit board, the first connecting member electrically connecting the first wiring layer to the electronic element; and a second connecting member arranged between the electronic element and the colloid, the second connecting member electrically connecting the lead terminal to the electronic element;

wherein the at least one lead comprises a first lead and a second lead, the first lead comprises a first lead body and a first lead terminal connected to an end of the first lead body, the second lead comprises a second lead body and a second lead terminal connected to an end of the second lead body, the first lead terminal and the second lead terminal are exposed from the colloid and spaced from each other;

wherein the colloid comprises a protrusion protrudes from the circuit board, the protrusion and the first wiring layer are on a same surface of the insulating body, and the first lead terminal is formed on the protrusion.

7. The packaging structure according to claim 6, wherein the circuit board further comprises a second wiring layer formed in the insulating body, the through groove comprises a first slot and a second slot connected to the first slot, the first slot and the second slot are arranged along a thickness direction of the circuit board, a width of the second slot is larger than a width of the first slot, and the second wiring layer is partially exposed from the second slot; another end of the lead body away from the lead terminal is electrically connected to the second wiring layer.

8. The packaging structure according to claim 6, wherein the circuit board further comprises a third wiring layer on another surface of the insulating body away from the first wiring layer, and another end of the lead body away from the lead terminal is electrically connected to the third wiring layer.

9. The packaging structure according to claim 6, wherein the packaging substrate further comprises a fourth wiring layer, and the fourth wiring layer is formed on a surface of the filled colloid away from the lead terminal; the first lead body comprises a first separating portion and a second separating portion, the second lead body comprises a third separating portion and a fourth separating portion, an end of the first separating portion is connected to the first lead terminal, another end of the first separating portion is electrically connected to the fourth wiring layer; the second separating portion is electrically connected to the fourth wiring layer and the circuit board; an end of the third separating portion is connected to the second lead terminal, another end of the third separating portion is electrically connected to the fourth wiring layer; the fourth separating portion is electrically connected to the fourth wiring layer and the circuit board.

10. The packaging structure according to claim 6, wherein the first wiring layer is embedded in the insulating body, and a surface of the first wiring layer away from the insulating body is flush with a surface of the insulating body.

* * * * *